United States Patent [19]

Morgan

[11] Patent Number: 6,029,235
[45] Date of Patent: *Feb. 22, 2000

[54] AUTOMATIC RELOADING OF SERIAL READ PIPELINE ON LAST BIT TRANSFERS TO SERIAL ACCESS MEMORY

[75] Inventor: Donald M. Morgan, Boise, Id.

[73] Assignee: Micron Technology, Inc., Boise, Id.

[*] Notice: This patent is subject to a terminal disclaimer.

[21] Appl. No.: 08/908,486

[22] Filed: Aug. 7, 1997

Related U.S. Application Data

[63] Continuation of application No. 08/410,117, Mar. 24, 1995, Pat. No. 5,678,017.

[51] Int. Cl.[7] ............................... G06F 12/00; G06F 13/00
[52] U.S. Cl. ................................ 711/169; 711/1; 711/105; 711/154; 711/167; 711/202; 711/203; 365/230.01; 365/230.04; 365/230.05; 365/230.09
[58] Field of Search ............................... 711/1, 100, 104, 711/105, 154, 167, 169, 200, 202, 203; 365/230.01, 230.04, 230.05, 230.09, 230.5

[56] References Cited

U.S. PATENT DOCUMENTS

| | | | |
|---|---|---|---|
| 4,839,856 | 6/1989 | Tanaka | 711/211 |
| 4,891,795 | 1/1990 | Pinkham et al. | 365/230 |
| 4,989,181 | 1/1991 | Harada | 365/200 |
| 5,042,014 | 8/1991 | Pinkham et al. | 365/230 |
| 5,097,447 | 3/1992 | Ogawa et al. | 365/200 |
| 5,179,372 | 1/1993 | West et al. | 340/799 |
| 5,198,999 | 3/1993 | Abe et al. | 365/189 |
| 5,200,925 | 4/1993 | Morooka | 365/219 |
| 5,206,831 | 4/1993 | Wakamatsu | 365/200 |
| 5,305,278 | 4/1994 | Inoue et al. | 365/230 |
| 5,313,431 | 5/1994 | Uruma et al. | 365/230 |
| 5,325,329 | 6/1994 | Inoue et al. | 365/189 |
| 5,325,332 | 6/1994 | Tagaya | 365/200 |
| 5,325,502 | 6/1994 | McLaury | 395/425 |
| 5,379,263 | 1/1995 | Ogawa et al. | 365/230.04 |
| 5,678,017 | 10/1997 | Morgan | 711/1 |

*Primary Examiner*—Tuan V. Thai
*Attorney, Agent, or Firm*—Schwegman, Lundberg, Woessner & Kluth P.A.

[57] ABSTRACT

A video RAM (VRAM) includes a dynamic random access memory (DRAM) having a serial I/O port coupled to a pipelined serial access memory (SAM). The pipelined SAM operates by partitioning a serial read operation into a sensing operation, a counter operation, and an output operation, where all three operations are performed concurrently in a pipelined fashion. The VRAM performs a split read transfer (SRI) operation where data is serially read from one portion of the SAM while new data is transferred from the DRAM to a another portion of the SAM The VRAM recognizes a late SRT operation occurring during the reading of the last bit from one of the SAM portions (known as a last bit transfer), when the address produced by a counter in the counter operation is one past a boundary of one of the SAM portions to invoke circuitry to automatically reload the counter and properly load the SAM pipeline.

20 Claims, 14 Drawing Sheets

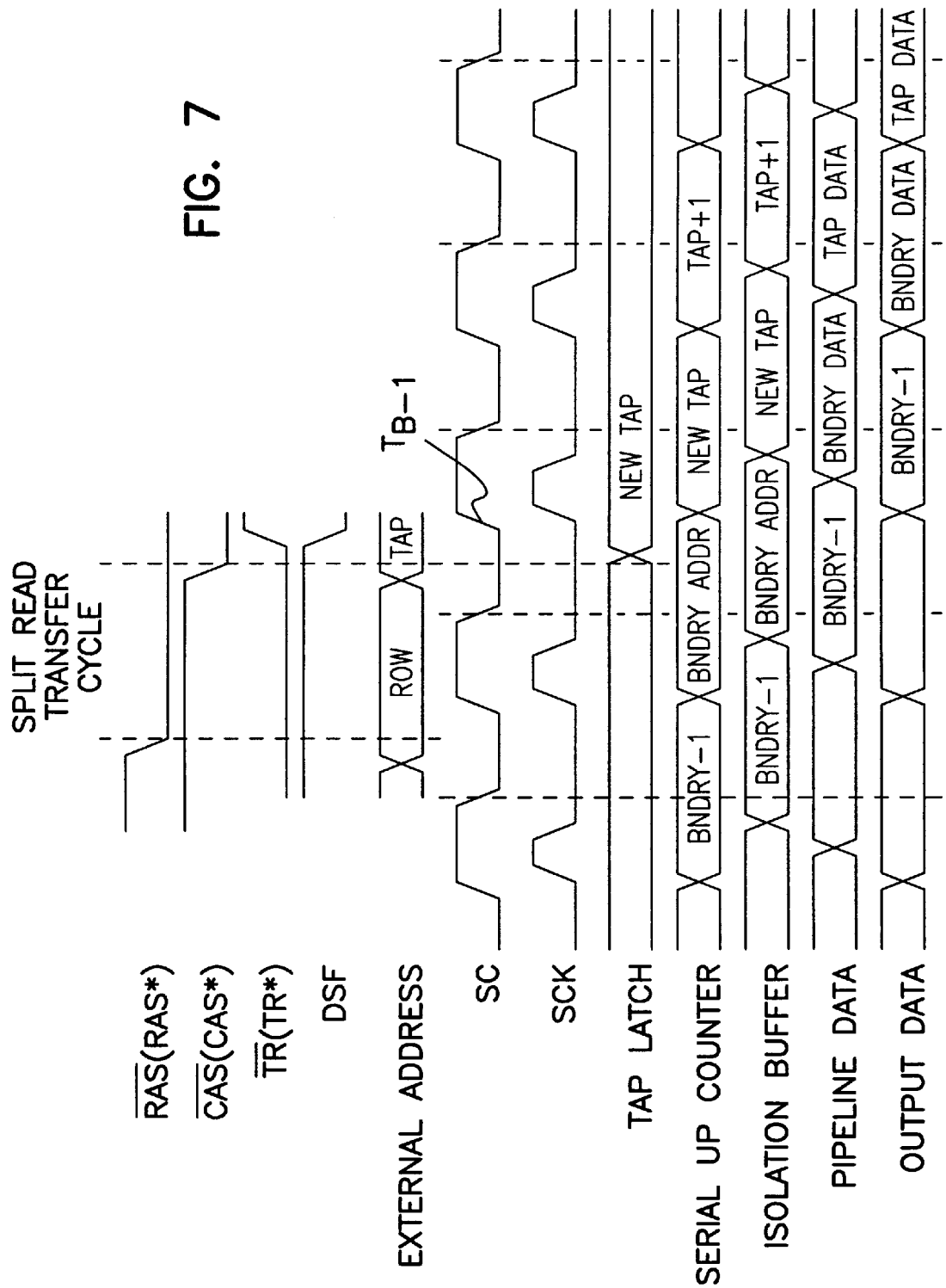

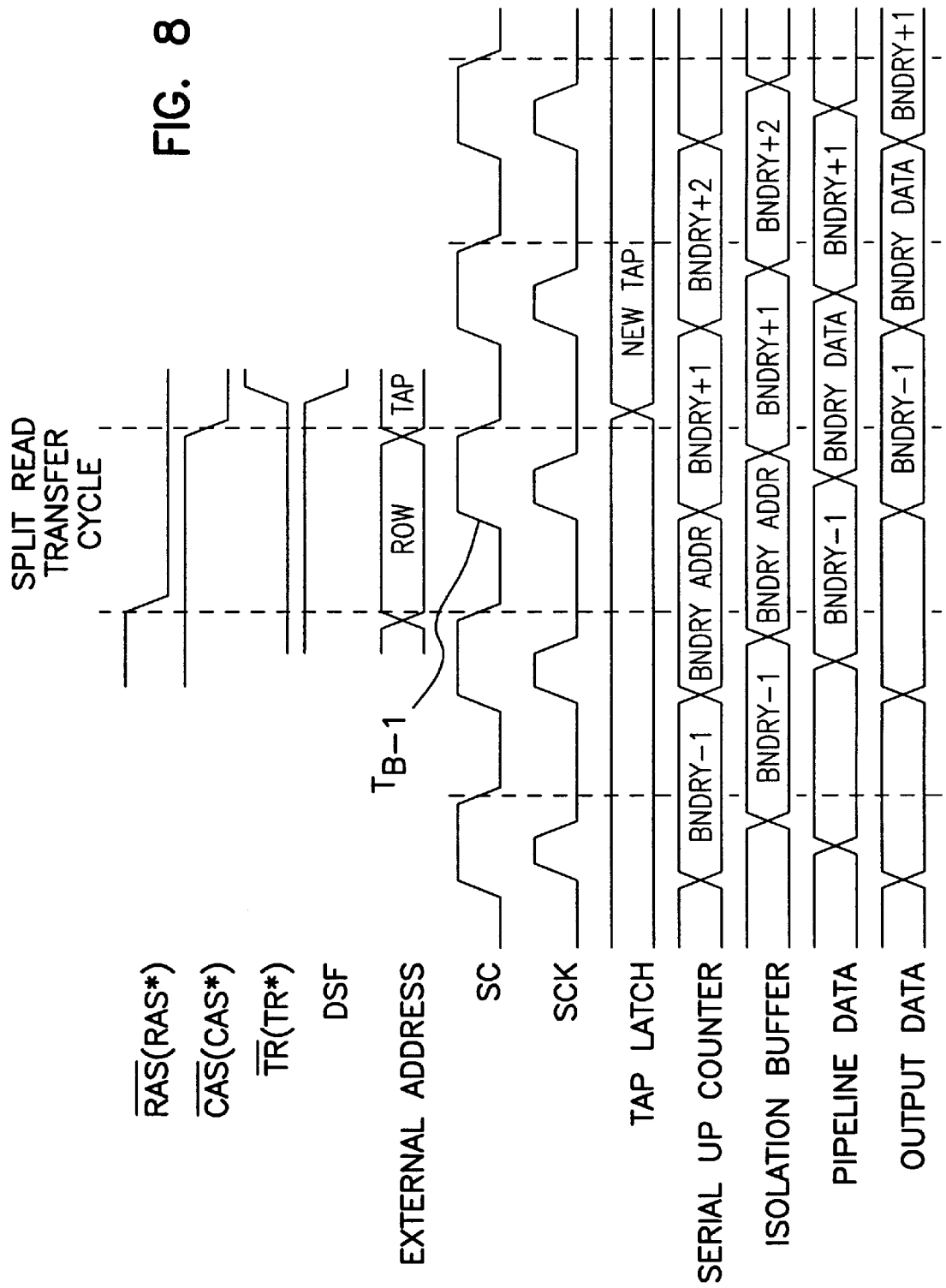

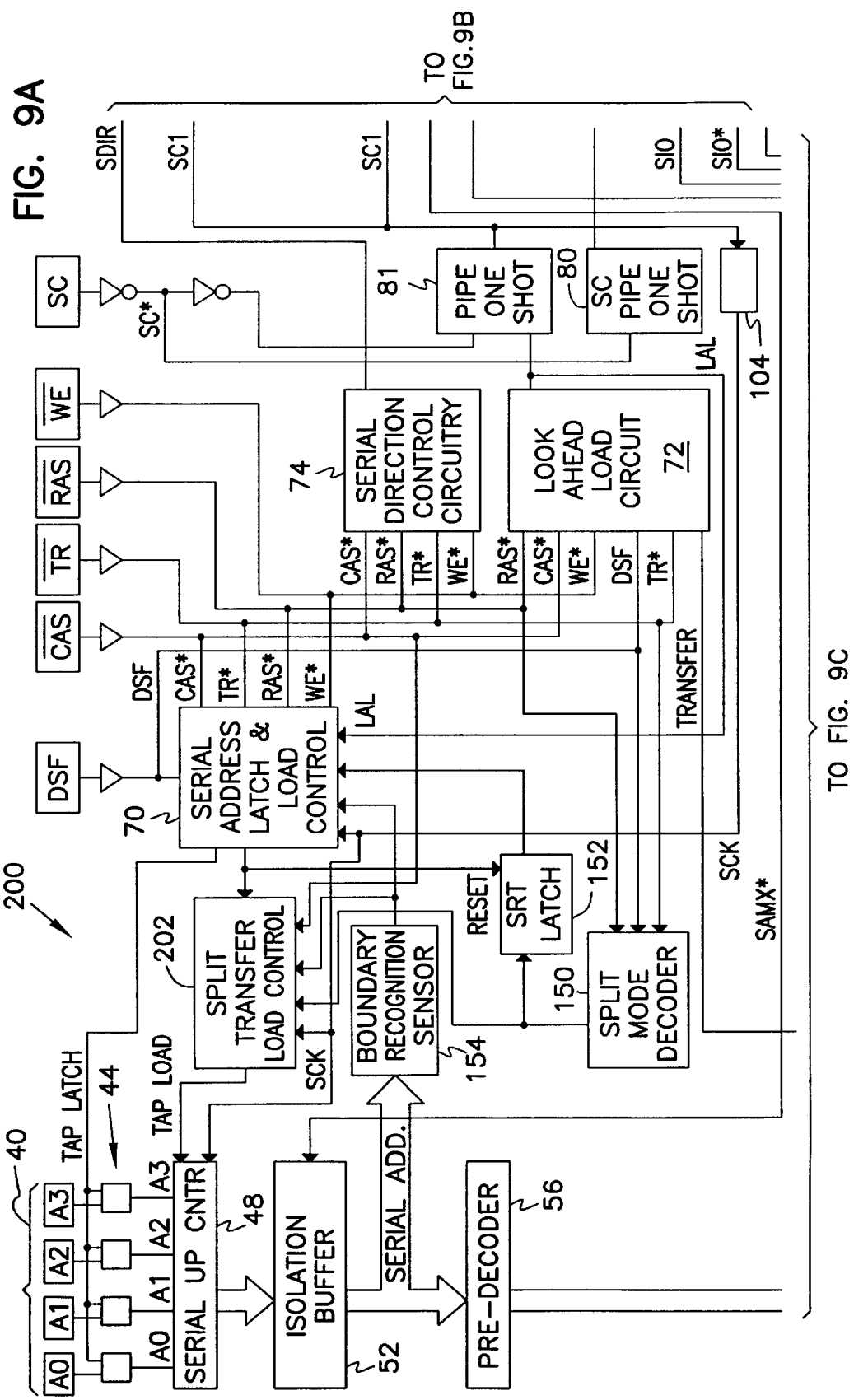

AUTOMATIC RELOADING OF SERIAL READ PIPELINE ON LAST BIT TRANSFERS TO SERIAL ACCESS MEMORY

"This application is a continuation of U.S. patent application Ser. No. 08/410,117, filed Mar. 24, 1995, now U.S. Pat. No. 5,678,017."

THE FIELD OF THE INVENTION

The present invention relates to semiconductor memory integrated circuits and, more particularly, to serial input and output operations in multiple port random access memory devices such as video RAMs.

BACKGROUND OF THE INVENTION

A video RAM (VRAM is a dynamic random access memory (DRAM) having a serial inputtoutput (I/O) port coupled to a serial access memory (SAM). The SAM permits a block of stored data to be rapidly accessed, while the normal access function of the DRAM is also occurring. The information stored in the SAM is normally obtained from, or input into, a primary memory on the VRAM The primary memory is typically configured as a DRAM array and is accessed according to normal DRAM protocols.

Information can be written into the VRAM at DRAM address speeds and output through the serial access port, or vice ver This serial writing and access capability is convenient for video applications because some address sequences, such as pixels in a raster scan, are predetemined The McLaury U.S. Pat. No. 5,325,502 entitled PIPELINED SAM REGISTER SERIAL OUTPUT, is commonly assigned to Micron Technology, Inc., the assignee of the present application, and is incorporated herein by reference. The U.S. Pat. No. 5,325,502 patent describes a VRAM having a faster serial read operation by pipelining the serial read operation The pipelined serial read operation performs many of the necessary serial read operations steps concurrently, rather than performing all of the steps serially as was done previously. In particular, the preferred embodiment described in the U.S. Pat. No. 5,325,502 patent pipelines the serial read operation by partitioning the serial read operation to form a sensing operation, a counter operation, and an output operation wherein all three operations proceed concurrently.

The U.S. Pat. No. 5,325,502 patent describes a pipelined SAM architects but does not address the situation where a split read tansfer operation is performed on a SAM split boundary. A need exists for a pipelined SAM hitecue VRAM, such as described in the U.S. Pat. No. 5,325,502 patent, which performs a split read transfer operation which meets normal, non-pipelined SAM specifications.

SUMMARY OF THE INVENTION

The present invention provides an integrated circuit responsive to command signals and a tap address signal for providing an output signal. The integrated circuit includes a memory array storing data, and a serial access register having multiple cells. The serial access register is divided into a first portion and a second portion. Transfer circuitry transfers selected data from the memory array into the first portion of the serial access register. A tap address latch stores the tap address signal. Pointing circuitry responds to the stored tap address signal to assign values to an internal address signal by starting at a tap address signal value. Reading circuitry reads cells in the second portion of the serial access register identified by the internal address signal, and provides the output signal corresponding to the read cells. Timing circuitry controls the transfer circuitry, the pointing circuitry, and the reading circuity so that the reading circuitry provides the output signal corresponding to a first cell in the second portion while: 1) the reading circuitry reads a second cell in the second portion; 2) the pointing circuitry assigns a value to the address signal corresponding to a third cell in the second portion; and 3) the transfer circuitry transfers selected data from the memory array into the first portion controller responds to the command signals and the internal address signal reaching a stop address boundary in the second portion to cause the pointing circuitry to re-start the value of the internal address signal at a tap address value in the first portion. The controller responds to the command signals up to the stop address boundary to cause the internal address to restart at the tap address value in the first portion.

In a preferred embodiment of the present invention the controller includes a boundary recognition sensor providing a boundary detect signal indicating that the data bit stored in the cell being read by the reading circuitry corresponds to the stop address boundary. A boundary latch preferably stores the state of the boundary detect signal in response to serial clock signal received by the integrated circuit Altematively, the controller includes a boundary +1 recognition sensor providing a boundary +1 detect signal indicating that the data bit stored in the cell being read by the reading circuitry is one past the stop address boundary.

The controller preferably includes circuitry generating a tap load signal to cause the intenal address to re-start at the tap address value in the fit portion. The tap load signal is generated when the data bit stored in the cell being read by the reading circuitry is one past the stop address boundary and the command signals indicate an initiation of a split read transfer operation to direct the timing circuitry to control the transfer circuitry to transfer the selected data into the first portion of the serial access register while the reading circuitry reads data from the second portion. The tap load signal is preferably generated in response to a state of one of the command signals which indicates that valid data is the tap address latch. In one embodiment of the present invention, the one command signal is a column address strobe signal used to strobe a state of the tap address signal into the tap address latch.

The stop address boundary is optionally programmable. In addition, more than one stop address boundary can be programmed for each portion of the serial access register.

BRIEF DESCRIPTION OF THE DRAWINGS

FIG. 7 is a timing diagram illuring a typical split read transfer sequence for the VRAM of FIG. 1 where the split read transfer cycle is prior to the serial clock watch clocks the boundary −1 SAM data from the VRAM.

FIG. 8 is a timing diagram illustrating an attempted split read transfer sequence for the VRAM of FIG. 1 were the split read transfer cycle is after the serial clock which clocks the boundary −1 SAM data from the VRAM.

FIGS. 9A–9C together form a block diagram of pertinent portions of a pipelined SAM architecture VRAM according to the present invention.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
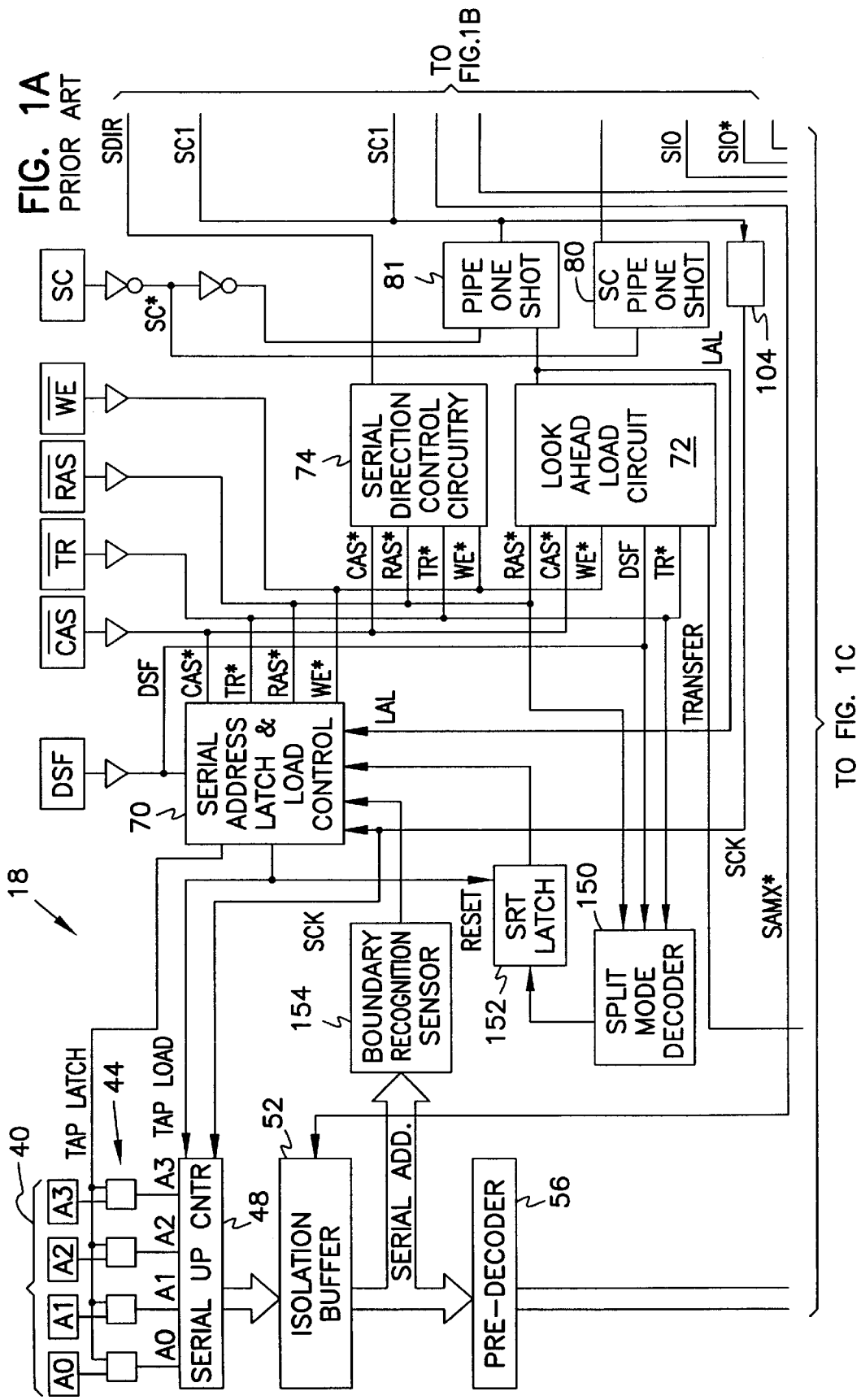
FIGS. 1A–1C together form a block diagram of pertinent portions of a prior art pipelined SAM architecture VRAM
Figure 1B:
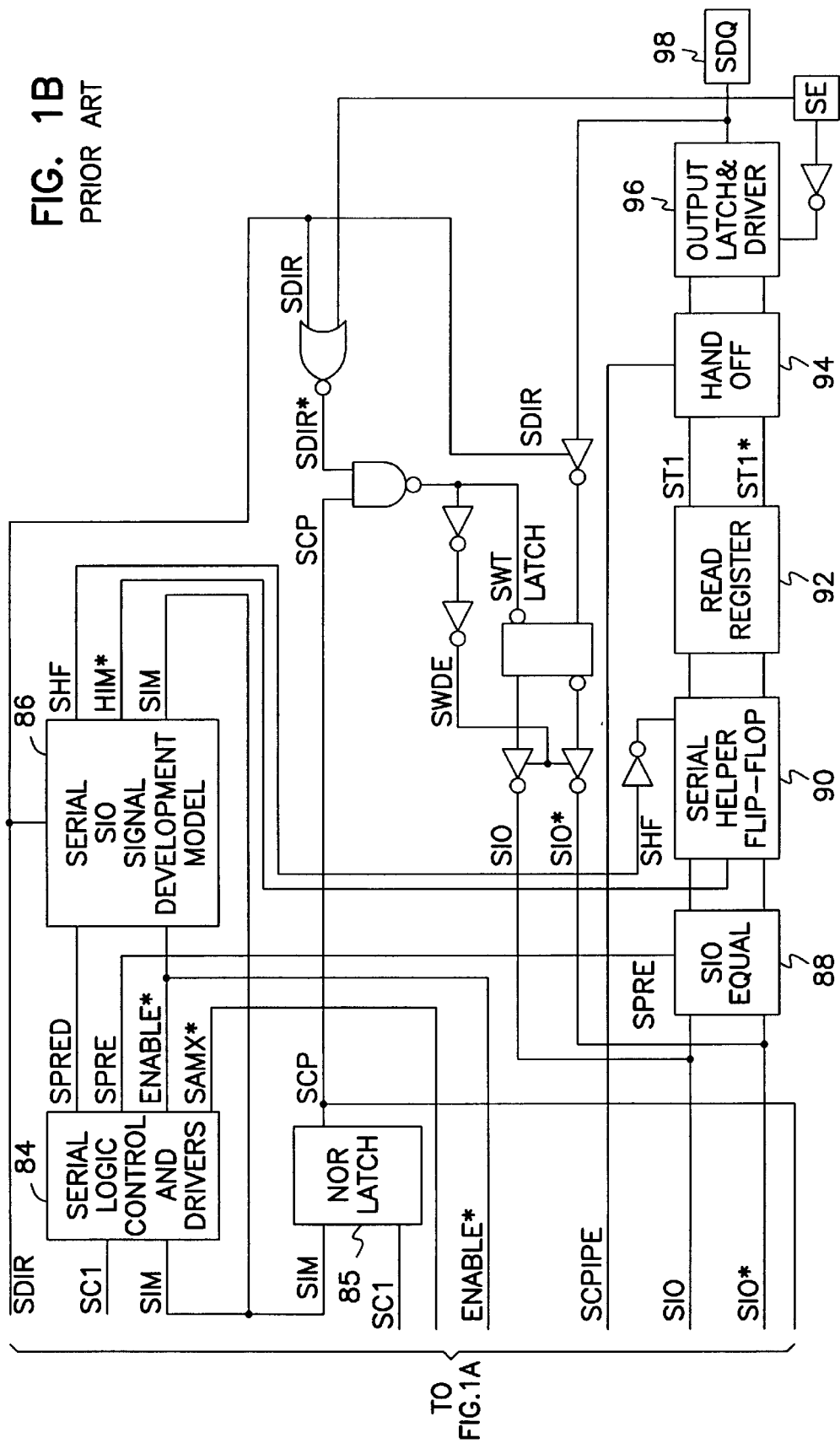

The present invention is best understood by first summarizing the operation of a known video RAM (VRAM) having a pipelined serial access memory (SAW) architecture. Portions pertinent to the serial output port operation of a known VRAM 18 which implements a pipelined serial read operation are illustrated in block diagram form in FIGS. 1A–1C. FIG. 2 shows the arrangement of FIGS. 1A, 1B, and 1C to form the pertinent portions of VRAM 18. A dynamic random access memory (DRAM) array 20 (FIG. 1C) is addressed by column decode and I/O circuitry 24 and row decoder/driver circuitry 28. Row and column address information are provided to the decoders along a common bus 29. A serial access memory or SAM register 32 is coupled to DRAM array 20 and includes one cell (or latch) for each column or bit position in DRAM array 20. Transfers between SAM register 32 and DRAM array 20 are controlled by pass control logic 36.

Figure 1C:
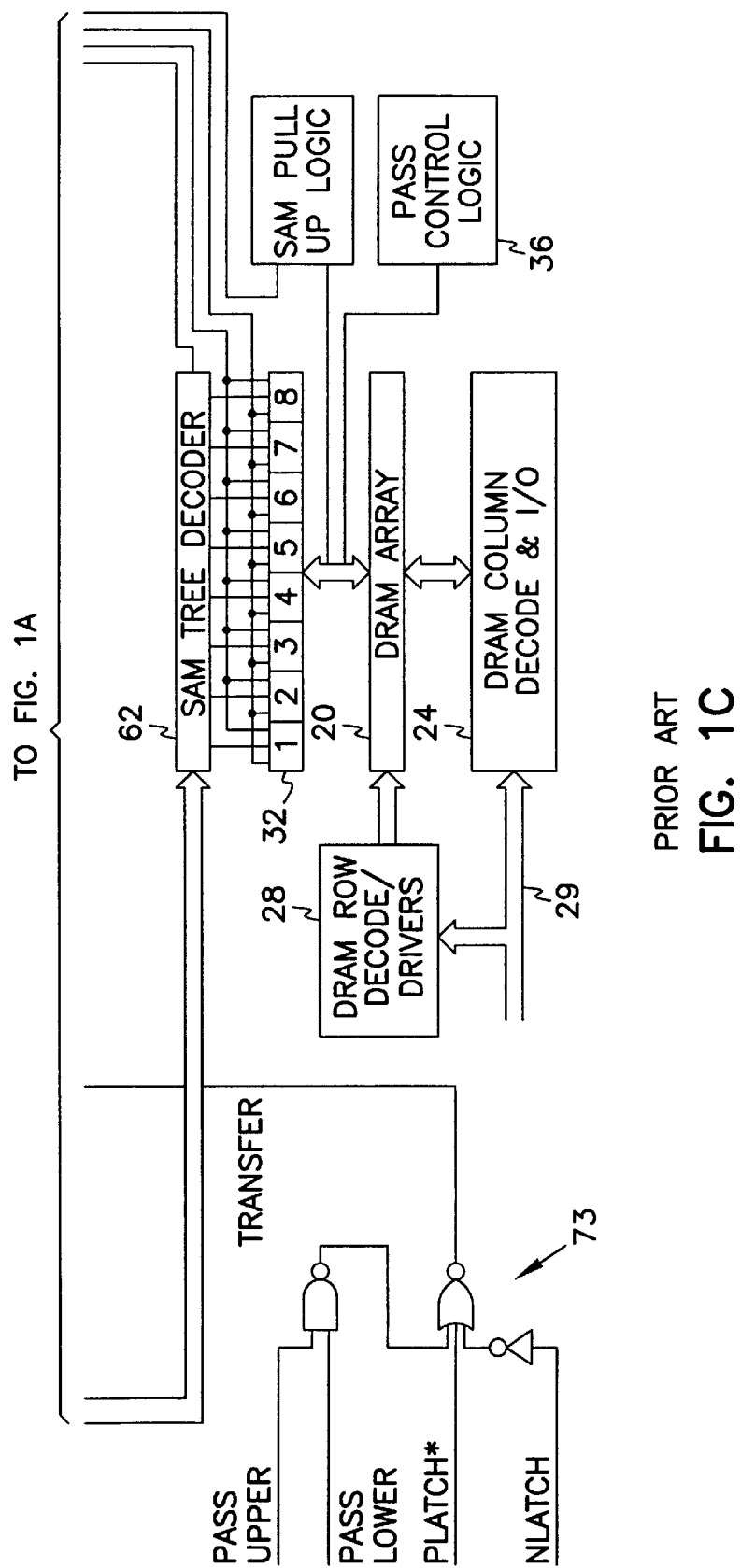
Figure 2:
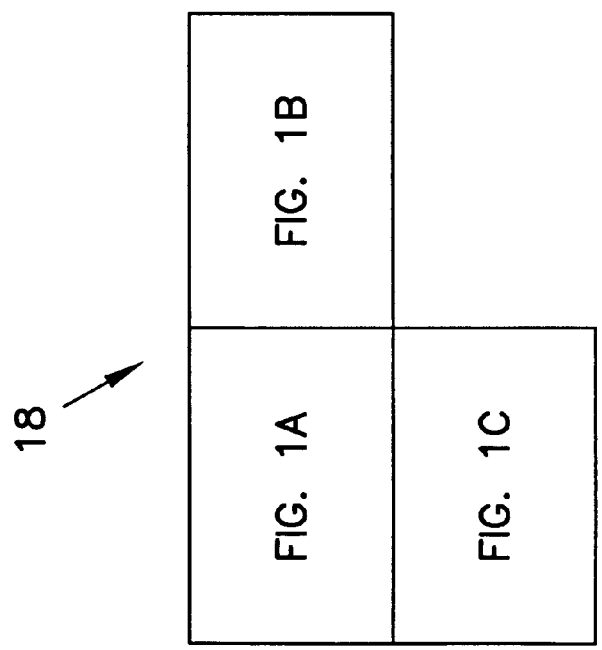
FIG. 2 is a diagram illustrating the arrangement of FIGS. 1A–1C.

Only 8 SAM latches, numbered 1–8, are illustrated in FIG. 1C for clarity. In an actual commercial embodiment, the SAM register is likely to include numerous SAM latches, such as 512 SAM latches to hold 512 bits. In addition, as is known in the art, both DRAM array 20 and SAM register 32 are optionally organized in words instead of bits, for example, 4 bit or 8 bit words. In an embodiment organized in words, both DRAM array 20 and SAM register 32 are organized in bit planes, such as 8 bit planes for an 8 bit word For example, a typical commercial embodiment of VRAM 18 may include 8 SAM register planes, each of 512 bits, to hold 512 words to accommodate a 512×512×8 DRAM array.

Transfer Operations

A transfer operation moves a row of data between DRAM array 20 and SAM register 32 as follows. For a read transfer, data is moved out of DRAM array 20 and into SAM register 32. For a write transfer, data is moved out of SAM register 32 and into DRAM array 20. Control signal input terminals shown along the top of the FIG. 1A input and buffer control signals CAS*, TR*, RAS*, WE*, DSF, and SC which control transfer and serial read operations. In general, a transfer operation is initiated when a transfer enable signal (TR*) is low prior to, or at, a row address strobe (RAS*) going low. The direction control signal (WE*) indicates the direction of transfer and must be high as RAS* goes low for a DRAM-to-SAM transfer (i.e., for a read). Row address bits are provided along bus 29 to select the DRAM array 20 row to be transferred to SAM register 32.

In serial output operations, a SAM starting address or "tap address" is provided to a series of address input terminals 40, and latched in a serial tap address latch 44. For clarity, four such address input terminals A0–A3 are illustrated in FIG. 1A. In practice, the number of terminals are equal to the amount needed to select one latch (bit) in SAM register 32. For example, 9 address bits are needed for a 512 bit SAM regster. The tap address is loaded into a pre-settable serial address up-counter 48. That tap address latch and load counter operations are controlled by serial address latch and load control circuitry 70.

The falling edges of the RAS* signal and a column address strobe (CAS*) signal are used to strobe the row and tap address bits, respectively, into VRAM 18. To complete a transfer operation, the TR* signal is taken high while the RAS* and CAS* signals are still low. The selective bits of DRAM data are then written into SAM register 32.

In a non-pipelined VRAM (not shown), the state of up-counter 48 would be provided directly to preecoder circuitry 56 which, in turn, provides address data to a SAM tree decoder 62. Tree decoder 62 decodes the tap address to access a selected one of the SAM latches. The tap address selected SAM latch contain the first bit to be sensed and outputrduing a serial output or read operation Thereafter, rccounter 48 is incremented so that successive SAM latches are accessed, sequentially, for reading the SAM data serially until the remainder of the data in the SAM register has been output or a different operation is invoked.

In contrast to a non-pipelined VRAM the VRAM 18 of FIG. 1 includes an isolation buffer 52 coupled between up-counter 48 and pre-decoder circuit 56. Isolation buffer 52 isolates the up-counter 48 output state from pre-decoder circuit 56 in response to a control signal SAMX*. SAMX* is generated by a serial logic circuit 84 (FIG. 1B), slightly after the beginning of any serial clock cycle. Intrinsic capacitance between series stages of isolation buffer 52 hold the output of isolation buffer 52 for supporting continued operation of pre-decoder 56 to thereby permit up-counter 48 to be incremented sooner in the read operation described below. Because of isolation buffer 52, it is not necesscry to wait for the address to propagate through tree decoder 62 and SAM register 32 before incrementing up-counter 48.

Non-Pipelined Serial Read Operation

The serial read operation is controlled by a serial clock (SC) signal provided at the SC input terminal. In a non-pipelined VRAM (not shown), in response to a rising edge of the SC signal, the address up-counter 48 is allowed to flow through the SAM address pre-decoder 56 and into SAM tree decoder 62 to access a selected SAM cell. The selected SAM cell transfers information onto SIO lines (SIO, SIO*).

A SAM cell is similar to a cross-coupled static latch. The SIO lines are pre-charged high. After the selected SAM cell is coupled to the SIO lines, a signal is developed gradually as one of the SIO lines falls toward a logic low. The amount of voltage displacement or the amount of charge that develops depends on the time provided. The time is determined in a serial SIO signal development model 86 which essentially models the time necessary for a predetermined voltage change of, for example, 200 Mv or 300 Mv on the SIO lines.

At the conclusion of a time period determined by model 86, a logic signal HIM* isolates a serial helper flip-flop 90 (operating as a serial sense amp) from the SIO lines, and logic signal SHF enables sensing by helper flip-flop 90. By operating as a serial sense amp, helper flip-flop 90 samples the SIO lines and latches the data. In a non-pipelined VRAM (not shown), helper flip-flop 90 provides output data directly to output latch and driver circuit 96. Output and latch and driver circuit 96 latches the valid information and drives the serial data IO terminal (SDQ) 98 to the state of the latched data. Next ounter 48 is incremented, and the above non-pipelined serial process is repeated to read the next bit from SAM register 32.

Thus, in a non-pipelined VRAM (not shown), reading serial data from the VRAM includes first conducting a DRAM-to-SAM (read) transfer operation, to transfer a selected row (or partial row) of data from the DRAM array into the SAM register. Next a read operation controlled by the SC signal is initiated. In a non-pipelined read operation, the following sequence of events are performed for each bit. The address data is sent from up-counter 48 directly to pre-decoder 62 and the tree decoder 62 is enabled. The selected SAM cell contents are dumnped onto the SIO lines. The SIO lines are sensed and helper flip-flop 90 latches the sensed data from the SIO lines. The output of flip-flop 90 is sent directly to and latched at output driver 96. The address up-counter 48 is then incremented. The output pin SDQ 98 is then driven to the state of the latched data by output driver 96. The SIO lines and helper flip-flop 90 are then equalized by SIO equalization/pre-charge circuitry 88.

Pipelined Serial Read Option

In VRAM 18, a pipelined serial read operation is implemented by isolating pre-decroer circuitry 56 from address upounter 48 with isolation buffer 52 to allow incrementing of up-ounter 48 sooner as described above under the Transfer operations heading. In addition, in the pipelined serial read operation, output latch and driver circuit 96 is isolated from sense amnp flip-flop 90 with a read register 92 (FIG. 1B) to allow driving the SDQ 98 output pad to the previous data bit state, while sensing the current data bit and latching the current data bit into read register 92.

As illustrated in FIG. 1B, read register 92 is disposed between helper flip-flop 90 and output latch and driver 96 to isolate the output latch from the flip-flop in the pipelined SAM architecture VRAM 18. A first output bit is latched in read register 92 immediately after enabling helper flip-flop 90. A master-slave hand-off circuit 94 is disposed between read register 92 and output latch 96. Read register 92, master-slave hand-off circuit 94, and output latch 96 form a master-slave flip-flop circuit Hand-off circuit 94 is enabled by a pulse on a control signal SCPIPE to transfer the first output bit from read register 92 to output latch 96. A SC PIPE one-shot 80 (FIG. 1A) is coupled to receive a serial clock signal (SC*) for providing the SCPIPE pulse in response to the SC* signal. The first output bit is moved, in response to the SCPIPE pulse, into output latch 96 immediately after the SC* signal. A second output bit is stored in read register 92 while output latch 96 retains the state of the first output bit A look ahead load circuit 72 is provided in VRAM 18 for pre-loading the "pipeline" so that the first data bit is available to output latch/driver 96 almost immediately after receipt of the first SC clock edge in a serial read operation. In other words, the look ahead load circuit pre-loads the pipeline without waiting for the SC clock pulse corresponding to the serial read operation.

Look ahead load circuit 72 receives the RAS*, CAS*, WE*, TR*, and DSF signals. The states of the CAS*, WE*, DSF, and TR* signals are latched in look-ahead load circuit 72 when the RAS* signal falls. If the appropriate combination of states of CAS*, WE*, DSF, and TR* are present at the time RAS* falls, then a look-ahead load (LAL) signal goes high Look-ahead load circuit 72 also receives a new signal called TRANSFER that is asserted when a read transfer is occurring. The TRANSFER signal is generated by logic 73 (FIG. 3C). The look ahead load circuit is arranged to assert a LAL signal high during a read transfer operation, following the rising edge of the TR* signal. As indicated above under the Transfer Operations heading, the TR* signal is driven high while RAS* and CAS* are still low to complete a read transfer operation.

A pipe one-shot 81 generates a SC1 pulse in response to either the LAL signal or the SC clock signal. The SCI pulse is coupled to the serial logic control and drivers circuit 84, to a NOR latch 85, and to a delay circuit 104. Delay circuit 104 in turn provides a SCK signal which is coupled to the address up-counter 48 for clocking the counter. SCK is delayed, but only slightly, to ensure that the address has been transferred into isolation buffer 52 before incrementing utcounter 48.

The LAL signal and SCK clock signals are also provided to the serial address latch and load control circuit 70, which in response provides a TAP LOAD signal to load the address from latch 44 into the address up-counter 48. In the pipeline serial read operation, a tap address is loaded at the end of the read transfer cycle without wvaiting for the SC clock pulse corresponding to the tap address. The loaded tap address is pre-decoded and passed through SAM tree decoder 62 to select the corresponding SAM latch (data bit). The selected SAM location in SAM register 32 is sensed, and the first data bit from the SAM is loaded into read register 92. Address upcounter 48 is then incremented. All of these operations occur prior to the first SC rising edge corresponding to the serial read operation.

When the first corresponding SC rising edge occurs, the first data bit from the SAM, now in read register 92, is transferred to output latch/driver 96 which drives the SDQ 98 tenninal to the state of the read register data. In this way, the first bit of data from the SAM is output from VRAM 18 very quickly atter the rising edge of the first corresponding SC signal. Simultaneously, the next data bit is accessed in SAM register 32, sensed, and loaded into read register 92. Address up-counter 48 is incremented to ready the pipeline circuit for the next SC clock signal. Responsive to the next SC clock signal, the next data bit from the SAM, now stored in read register 92, is transferred to output latch/driver 96. The cycle as just described above is then repeated.

In the above described pipelined serial read operation many of the necessary read operation steps are performed concurrently, rather than performing all of them serially as in the non-pipelined VRAM By performing the sensing operation, the counter operation, and the output operation concurrently, simulations show that serial port cycle time can be increased by approximately 40 to 50%. In addition, the access time ($t_{SAC}$) is reduced by approximately 75%

The tree operations and the related control logic signals of the pipelined read operation of VRAM 18 are summarze in Table I below. The pipeline serial read operation is described in flier detail in the above-incorporated U.S. Pat. No. 5,325, 502, which shows iming diagrams and further circuit diagrams illustrating the details of the difference between non-pipelined and pipelined read operations in a VRAM.

TABLE I

PIPELINED SERIAL READ OPERATION

| Description | Control Logic Signal |
|---|---|
| OUTPUT OPERATION | |
| 1. Transfer Read Register data to output latch (master/slave) | SCPIPE |
| 2. Drive Output Terminal (SDQ) | |
| SENSING OPERATION | |
| 1. Turn off equalization of SIO lines and | SPRE |
| Enable Serial Decoder | ENABLE* |
| 2. Access selected SAM cell and develop signal on SIO lines | |
| 3. Isolate SIO lines from Serial Helper Flip-Flop (SHFF) | HIM* |
| and latch the SHFF, which automatically sets the Read Register to the proper state | SHF |
| 4. Disable the Serial Decoder; | ENABLE* |
| Equalize SIO lines; | SPRE |
| Disable SHFF and reconnect the SHFF to the | SHF |
| equalizing SIO lines. | HIM* |
| COUNTER OPERATION | |
| 1. Isolate the counter from the pre-decoder (sample & hold) | SAMX* |
| 2. Increment the counter | SCK |
| 3. Reconnect the counter to the pre-decoder | SAMX* |

Split Read Transfer Operations

The split read transfer (SRT) operation is not addressed in the U.S. Pat. No. 5,325,502, but is a known VRAM operation. The SRT operation eliminates the critical transfer tining required to maintain the continuous serial output data stream. When using normal transfer cycles to do mid-line reloads, a real-time read transfer must be performed. The real-time read transfer has to occur between the last clock of "old data" from SAM register 32 and the first clock of "new data" from SAM register 32. Conversely, in the SRT operation, while data is being serially read from one half of SAM register 32, new data from DRAM array 20 is transferred to the other half of SAM register 32. The transfer from DRAM array 20 to one half of SAM register 32 can occur at any time while the other half of SAM register 32 is sending data, and is not synchrorized with the SC signal.

Timing requirements related to the TR* signal are also relaxed for SRT cycles. Unlike the normal transfer operations, the rising edge of the TR* signal is not used to complete the transfer cycle in the SRT operation. Therefore, the timing of the rising edge of the TR* signal is independent of the falling edge of the CAS* signal and the rising edge of the SC signal. The transfer timing is generated internally in VRAM 18 for SRT cycles. A SRT operation does not change the direction of the SAM I/O port as controlled by serial direction control circuitry 74, which provides serial direction signal (SDIR).

A "fall" read transfer cycle must proceed any sequence of SRT cycles to provide a reference to which half of SAM register 32 will be first accessed and to also set the SAM I/O direction. After the full read transfer cycle, an SRT cycle is initiated when the DSF signal is high when the RAS* signal goes low during the transfer cycle. As in non-split transfers, the row address provided from row decoder/driver circuitry 28 is used to specify the DRAM array 20 row to be transferred to SAM register 32. The column address (illustrated figuratively as A0–A3 in FIG. 1A) is used to input the SAM tap address. The most significant address bit pin (address pin A3 as illustrated is FIG. 1A) is a "don't care" in a SRT operation when the tap address is loaded at the high-tolow transition of CAS*. In a typical commercial embodiment having a SAM register of 512 bits, address pin A8 would be a "don't care." The most significant address pin is a "don't care," because the most significant address bit is generated internally in VRAM 18 in such a manner to force the split transfer to the SAM register 32 half not being accessed.

A split mode decoder 150 decodes the RAS*, the DSF, and the TR* signals to provide a SRT signal. The SRT signal supplied by the split mode decoder is latched by SRT latch 152 to save the state of the SRT signal. SRT latch 152 is reset by the TAP LOAD signal provided by serial address latch and load control circuitry 70. The SRT latch 152 provides the stored state of the SRT signal to serial address latch and load control circuitry 70. Boundary recognition sensor 154 senses when the serial address from isolation buffer 52 is at a SAM boundary to provide a boundary detect signal to serial address latch and load control circuitry 70. The boundary detect signal going high indicates that access must begin from the other half of SAM register 32.

Figure 3:
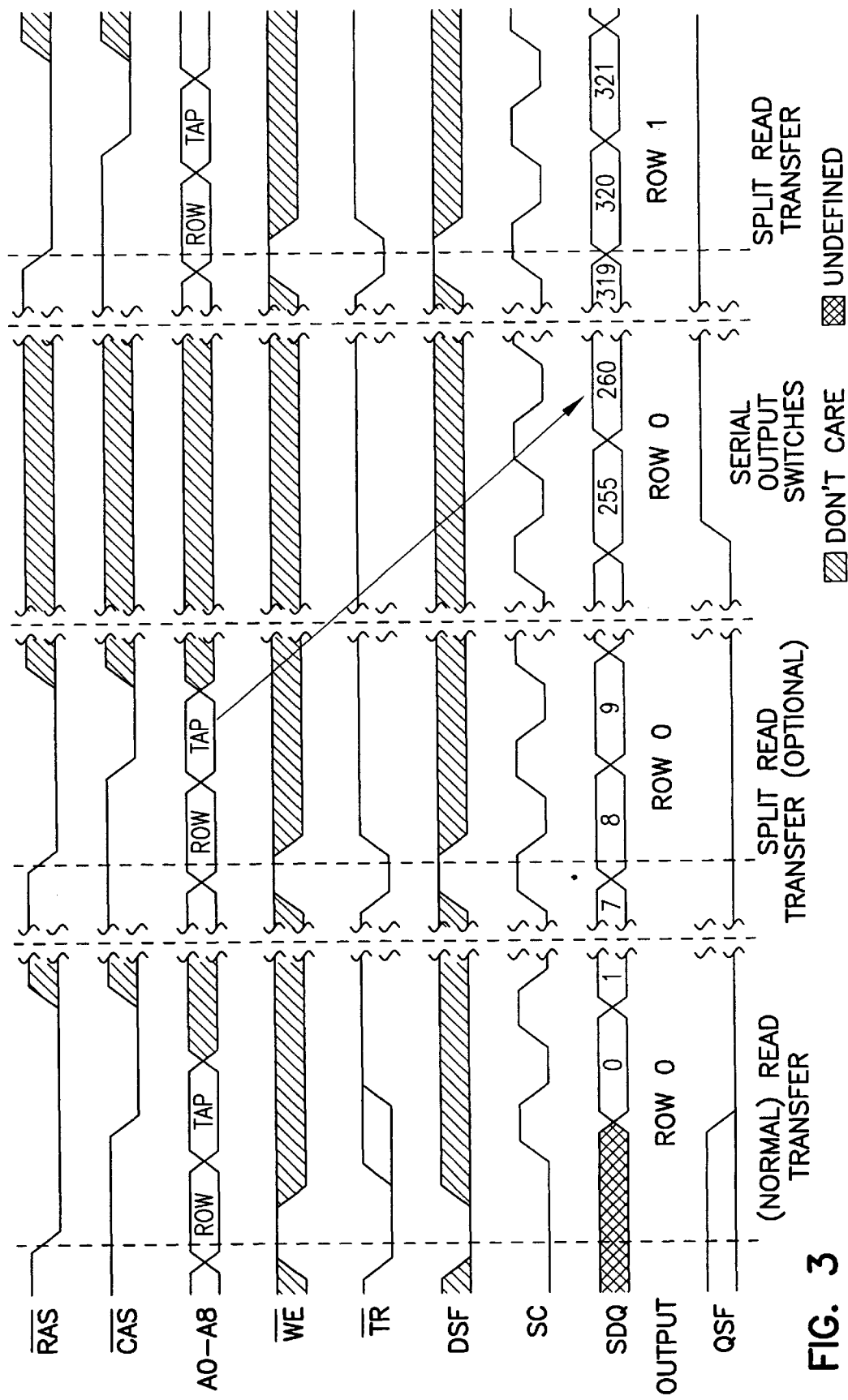
FIG. 3 is a timing diagram illusing a typical split read transfer initiation sequence.

FIG. 3 is a timing diagram illustrating a typical SRT initiation sequence for a SAM register of 512 bits. A QSF output signal (not shown in FIG. 1) is indicated on the timing diagram and indicates split SAM status. The QSF signal is low when the lower half of the SAM register (bits 0–255 for a 512 bit SAND is being accessed and is high when the upper half of the SAM register (bits 256–511 for a 512 bit SAM) is being accessed. A normal read transfer is performed first, for example from row 0 of the DRAM array, followed by a first SRT cycle to the same row to the upper half of the SAM register. The first SRT cycle to the upper half of the SAM needs to be performed only if the tap address for the upper half is not equal to zero, because the row data from the DRAM array has already been transferred into the SAM register during the full read transfer. The only reason for performing the first SRT to the upper half of the SAM is to latch the tap address which will then be used when the serial access from the SAM register switches from the lower half of the SAM to the upper half of the SAM.

Figure 4:
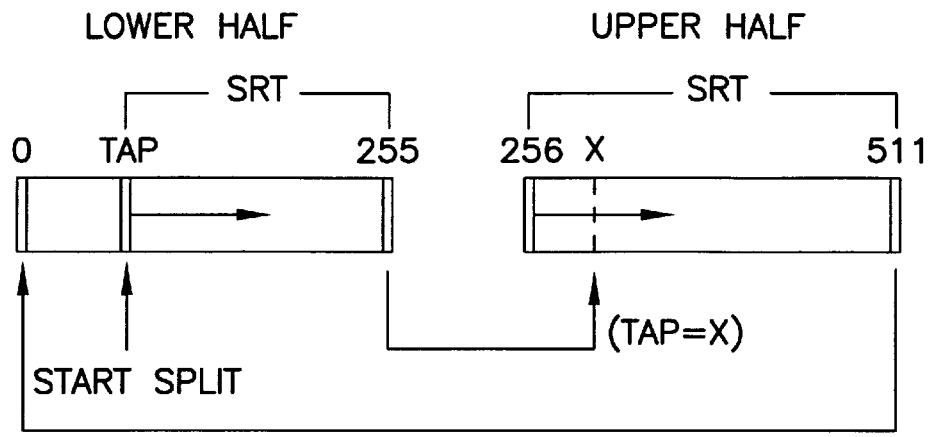
FIG. 4 is a diagram illusing a split read transfer operation transition from a lower half to an upper half of a SAM
Figure 5:
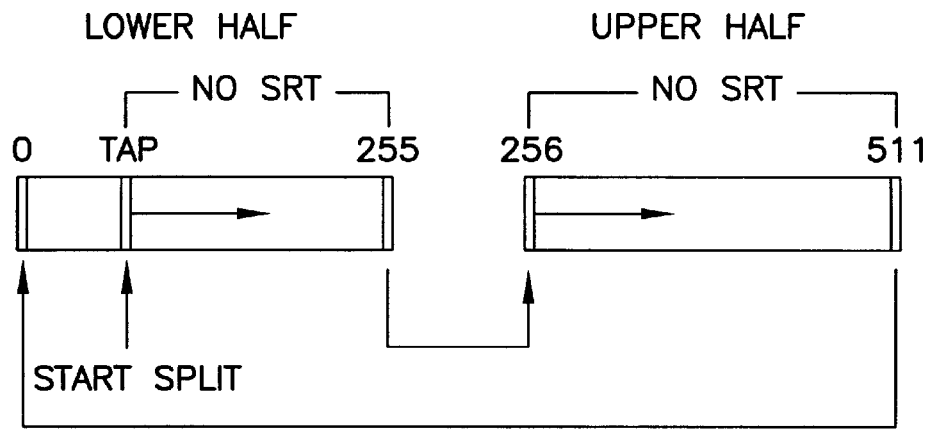
FIG. 5 is a diagram illusing a transition from a lower half to an upper half in a normal read transfer operation.

Serial access continues until the SAM address upeounter reaches 255 (i.e., A8=0, A0–A7=255). At this point in time, the QSF output goes high and, if an SRT was performed for the upper half the new tap address is loaded for the next half (i.e., A8=1, A–A7=tap address). In the example SRT initiation sequence illusrated in FIG. 3, the latched tap address is equal to 4, which indicates that the starting address (tap address) for the serial access from the upper half of the SAM register is 260(i.e. A8=1, A0–A7=4). This jump to the tap address in the upper half of the SAM is illustrated in diagram form in FIG. 4. FIG. 5, illustrates in diagram form, that under the conditions where the tap address for the upper half is equal to zero, the first SRT cycle is not performed, and the address increments from 255 to 256.

Once the serial access has switched to the upper half of the SAM as indicated by QSF going to a high level, new data, for example row 1 data from the DRAM aray, can be transferred to the lower half of the SAM. The next SRT operation step, which is not illustrated in FIG. 3, is to wait until QSF goes low indicating that row 1 data is shifing out of the lower SAM, and then execute an SRT to transfer data from the upper half of row 1 of the DRAM array to the upper half of the SAM. If the half-boundary is reached before an SRT cycle is performed for the next half, the VRAM leaves split mode and access starts from address 256 if going to the upper half or at zero if going to the lower half, such as in the transition from the lower half to the upper half of the SAM illustrated in FIG. 5.

Referring back to FIG. 1, serial address latch and load control circuitry 70 generates a TAP LOAD pulse when the boundary detect signal from boundary recognition sensor 154 goes high, indicating the crossing of a SAM boundary, and the latched SRT signal is high, indicating a previously performed SRT cycle. Thus, serial address latch and load control circuitry 70 generates a TAP LOAD pulse when a SAM boundary is crossed after a SRT cycle in addition to generating a TAP LOAD pulse for the above described combination of events which cause a TAP LOAD pulse to occur on a non-split (full) SAM transfer, as dictated by the look-ahead load (LAL) signal from look-ahead load circuit 72.

The SAM boundary is referred to as the stop address boundary or stop point and represents the point at which the serial SAM access changes to the next half of the SAM The stop address boundary is optionally prog almable in VRAM 18 as described below under the Progmmable Stop Address Boundary heading.

Programmable Stop Address Boundary

An optional programmable split SAM operation mode of VRAM 18 is an extension of the split SAM mode. The programnable split SAM mode permits optimization of SAM performance by allowing user-programmable stop points or stop address boundaries to be defined in the split SAM. A stop point represents a SAM location at which the access changes from one half of the SAM to the tap address in the other half of the SAM The locations of the stop points are, for example, programmable in powers-of-two increments. Example stop points to create partition sizes of 1×256, 2×128, 4×64, 8×32, and 16×16 are shown in TABLE II below. The stop points and resulting partition sizes are programmed in a special program cycle prior to transfer and serial access operations so that the stop points are useable during the transfer and serial access operations. The stop points cannot be programmed during transfer cycles because all of the address bits are used to specify the row of the DRAM array to be transferred.

TABLE II

| Number Stop Points/Half | Address @ RAS* LOW A0–A3 = "don't care" | | | | | Number and Size of Partition(s) |
| --- | --- | --- | --- | --- | --- | --- |
| | A8 | A7 | A6 | A5 | A4 | |
| 1 (Default) | X | 1 | 1 | 1 | 1 | 1 × 256 |
| 2 | X | 0 | 1 | 1 | 1 | 2 × 128 |
| 4 | X | 0 | 0 | 1 | 1 | 4 × 64 |
| 8 | X | 0 | 0 | 0 | 1 | 8 × 32 |
| 16 | X | 0 | 0 | 0 | 0 | 16 × 16 |

Figure 6:
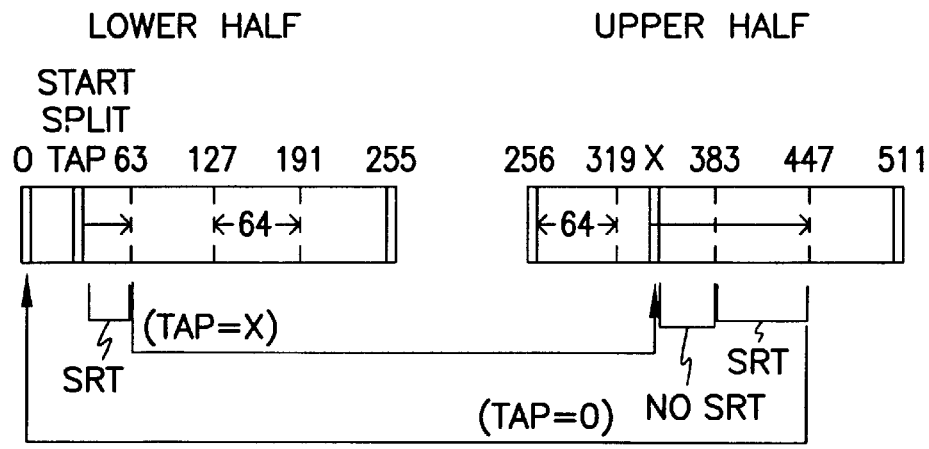
FIG. 6 is a diagram illusing a split read transfer operation transition from a lower half to an upper half of a SAM based on a programmable stop address boundary.

A defined partition of 4×64 per each half of the SAM is illustrated in FIG. 6. As illustated, bits A7–A4 are 0011, respectively. Access progresses from the tap address to the end of a defined partition, as defined by a programmable stop point, such as 63 for the first partition in the lower half of the SAM When the end of the defined partition is reached, the access jumps to the tap address of the other half of the SAM, provided that a SRT cycle was performed before the partition boundary was reached. If a SRT cycle is not performed prior to reaching the stop point of the defined partition, the partition is not recognined and the address count continues in the same half of the SAM such as illustrated in FIG. 6 at stop point 383. The address count continues to increment in the same half of the SAM until a SRT cycle occurs or the SAM half boundary is reached. In FIG. 6, a SRT cycle occurs sometime between addresses 383 and 447, and the SAM boundary is recognized at stop point 447.

Last-Bit Transfers

A problem with the SRT operation in the pipelined SAM architure VRAM 18 is that the TAP address is loaded from tap latch 44 to the serial up-counter 48 in response to a serial access initiated by the SC clock only if the conditions described above are met by the time that SC clock occurs. If a SRT cycle is not detected prior to a boundary detection, the boundary detect signal from boundary recognition sensor 154 will have gone low by the time the SRT cycle finally occurs. In this case, the conditions that cause the TAP LOAD pulse to be generated in serial address latch and load control circuitry 70 are not met. Even if the circuitry was altered to recognize the late boundary conditions, the TAP LOAD pulse derived from the SC clock as a result of the late boundary conditions would cause invalid data to be loaded from tap latch 44 into up-counter 48 if the SC clock happens to occur prior to the fall of the CAS* signal in the SRT cycle. This situation can occur because, in the industry standard VRAM specification, the SC clock and the CAS* signal operate asynchronously with respect to each other.

The same occurrence of the SC clock which loads read register 92 with the data from the boundary bit of SAM register 32 also causes boundary −1 data to be loaded into output latch and driver 96 and output at the SDQ 98 terminal. Thus, a new tap address must be loaded at least one fill cycle early. This requirement dictates that the SRT operation cannot be performed when the next serial access will output boundary data, because the SRT operation would not be recognie to load the tap address until the next time a boundary is crossed. If the SRT operation was performed, the data provided from the VRAM on the next SC clock would not reflect the desired new SAM data.

Thus, in prior art VRAM 18, the latest time to perform a SRT operation is before the SC pulse corresponding to the last data output prior to a SAM boundary. The latest time to perform a SRT cycle is illustrated in the timing diagrams of FIGS. 7 and 8. In FIG. 7, with RAS* low, CAS* high, TR* low, and DSF high, a SRT cycle is indicated between the falling edge of the RAS* signal and the falling edge of the CAS* signal. In FIG. 7, the falling edge of the RAS* signal is during the time that the address from serial up-counter 48 is at the boundary −1 address. The falling edge of the CAS* signal occurs prior to the rising edge of the SC pulse, indicated at time $T_{B-1}$, vhich is used to transfer the boundary −1 SAM data bit from read register 92 to output latch 96.

In FIG. 7, the normal SRT cycle can occur because the new tap address is loaded based on the SCK rising edge following the SC clock rising edge at $T_{B-1}$. Accordingly, when up counter 48 reaches the boundary address, the up-counter is loaded with the new tap address from tap latch 44. The new tap address is sent into isolation buffer 52, and is then used to drive the pipeline data corresponding to the new tap address, which is then provided from VRAM 18 as output data corresponding to the new tap address at the rising edge of the SC pulse.

The timing diagram of FIG. 8 illustrates that VRAM 18 fails to load the tap address if a SRT cycle is attempted after the rising edge of the SC pulse used to initiate the transfer of the boundary −1 SAM data bit from read register 92 to output latch 96. In FIG. 8, the falling edge of the RAS* signal is during the time that the address from serial up-counter 48 is at the boundary address. The falling edge of the CAS* signal occurs after the rising edge of the SC pulse at time $T_{B-1}$ for clocking the boundary −1 SAM data bit from read register 92 to output latch 96.

Contrary to the situation illustrated in FIG. 7, in the situation illustrated in FIG. 8, the SRT cycle is attempted after the SC pulse corresponding to the boundary −1 data. Therefore, the SRT operation cannot occur, because the SCK clock corresponding to the SC pulse at time $T_{B-1}$ is already past when the new tap address is loaded into TAP latch 44. Thus, when up-counter 48 reaches the boundary address, rather than being loaded with the new tap address, the upecounter increments to the boundary +1 address, which is then placed in isolation buffer 52. Correspondingly, the pipeline data goes from the boundary data to the boundary +1 data, and the output data goes from boundary data to boundary +1 data, instead of proceeding from the boundary data to the new tap address data.

Automatic Pipeline Reloading on Last-Bit Transfers

Figure 10:
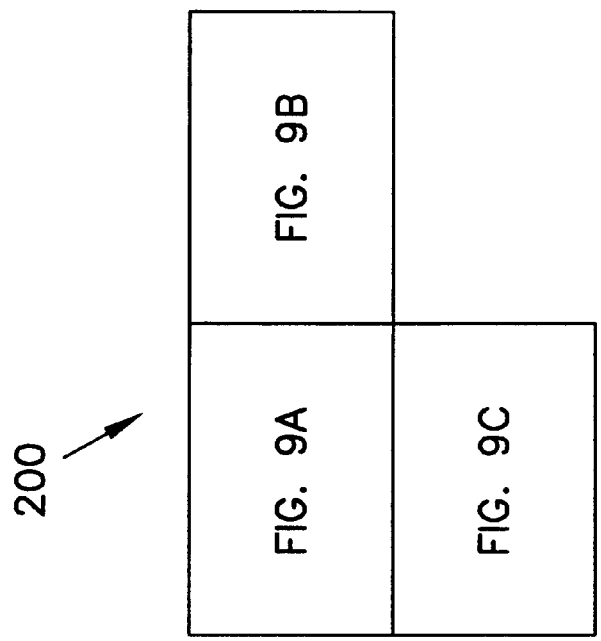
FIG. 10 is a diagram illusing the arrangement of FIGS. 9A–9C.
Figure 9B:
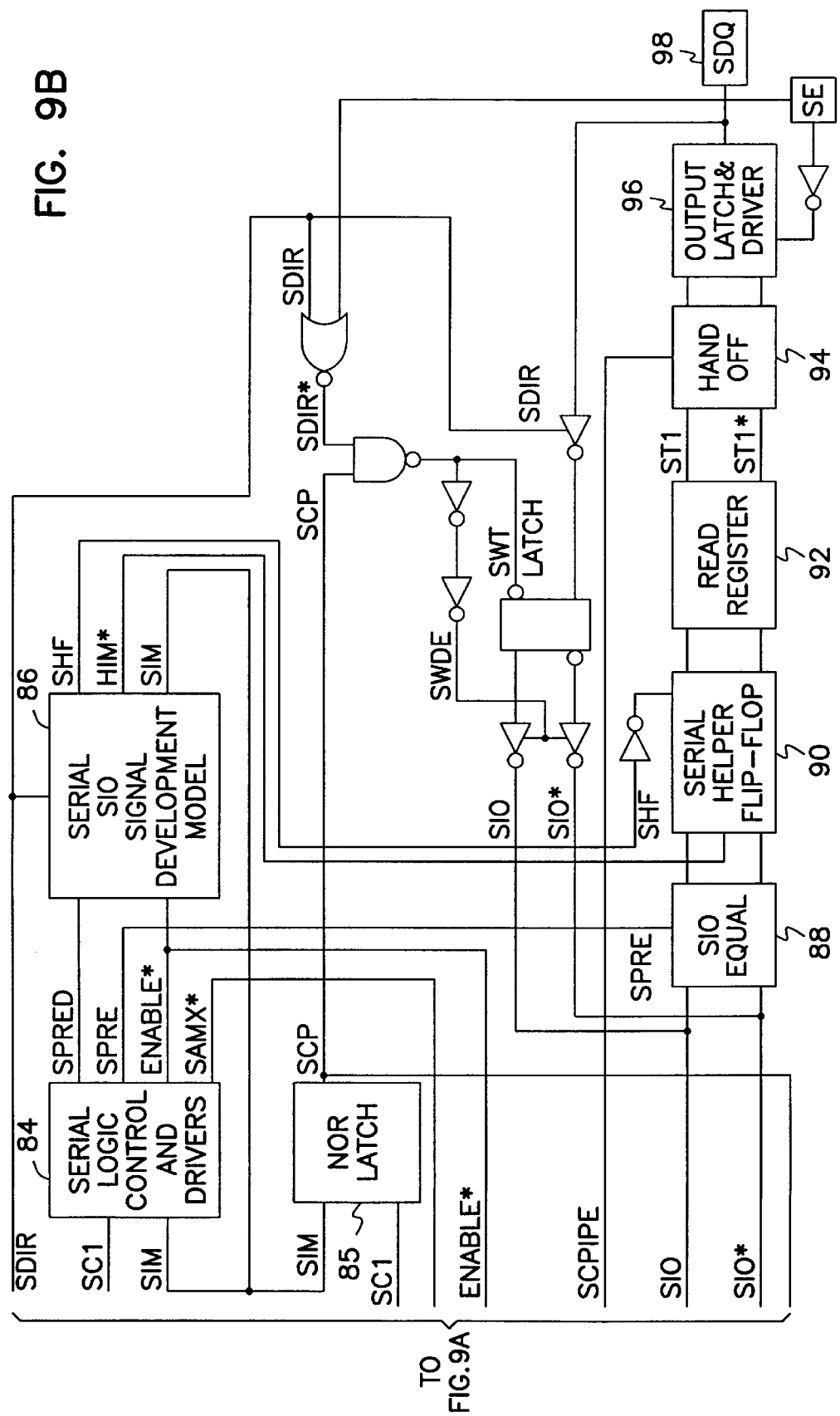
Figure 9C:
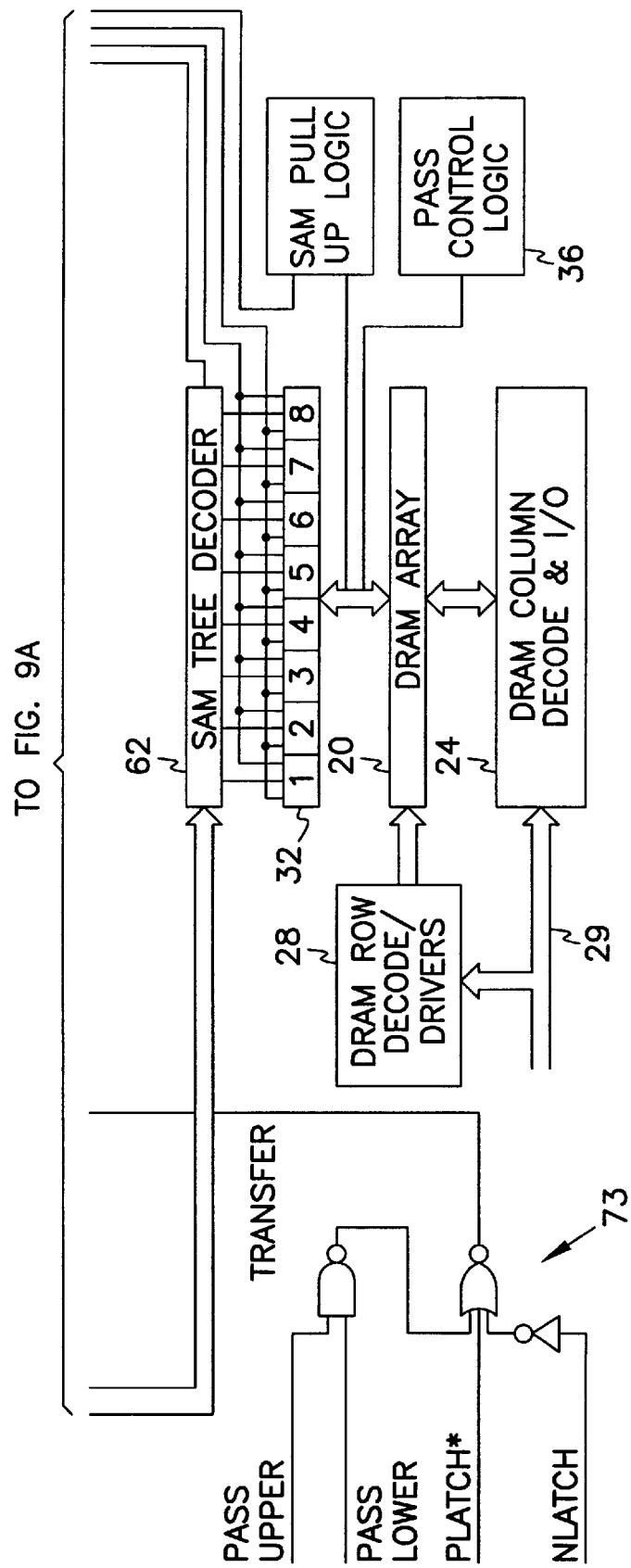

What others failed to recognize is that some means must be provided to detect the unique situation where the SRT cycle occurs after the SC clock has loaded boundary data into read register 92, and in this case, the TAP LOAD signal needs to be derived from some signal other than the SC clock to guarantee that the tap address in TAP LATCH 44 is valid. Portions pertinent to the serial output port operation of a pipelined SAM architecture VRAM 200 according to the present invention are illustrated in block diagram form in FIGS. 9A–9C. FIG. 10 shows the arrangement of FIGS. 9A, 9B, and 9C to form the pertinent portions of VRAM 200. In FIGS. 9A–9C, much of the VRAM 200 circuitry is similar to the VRAM 18 circuitry described above and illustrated in FIGS. 1A–1C. Accordingly, like reference numbers are used to identify elements common to both FIGS. 1 and FIG. 9.

VRAM 200 includes split transfer load control circuitry 202, which receives the original TAP LOAD signal provided from serial address latch and load control circuitry 70 based on the SCK signal. In addition, split transfer and load control circuitry 202 receives the CAS* signal; the SRT signal from split mode decoder 150 prior to being latched by SRT latch 152; the boundary detect signal from boundary recognition sensor 154; and the SCK clock Split transfer load control circuitry 202 provides a new TAP LOAD signal according to the present invention which is active for the original serial load cases derived from the SC clock for the normal look ahead load conditions, or the conditions resulting from crossing a SAM boundary after a SRT cycle. In addition, split transfer load control circuitry 202 provides an active TAP LOAD pulse to trigger reloading of the tap address from tap latch 44 into up-counter 48 on last bit transfers during a SRT cycle.

Figure 11:
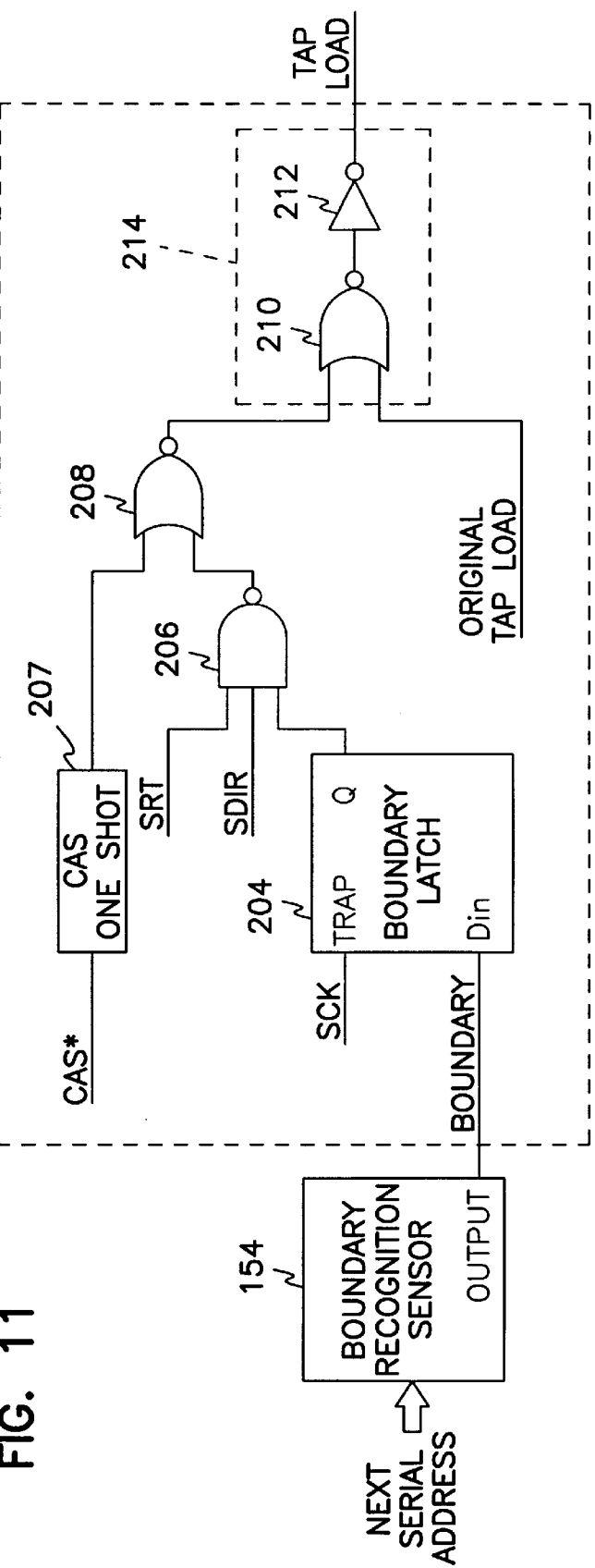
FIG. 11 is a schematic diagram illustrating details of split transfer load control circuitry for the VRAM of FIG. 9.

FIG. 11 is a schematic diagram illustratg the logical components of split transfer load control circuitry 202. A boundary latch 204 latches the state of the boundary detect signal from boundary recognition sensor 154 on each serial cycle at the rising edge of the SCK pulse. A three input NAND gate 206 receives the trapped boundary signal from boundary latch 204 on one of its inputs. The SRT signal from split mode decoder 150 is provided on a second input of NAND gate 206, and the SDIR signal is provided on a third input of NAND gate 206. NAND gate 206 provides a low signal when: 1) the boundary latch 204 output is high, indicating that the last address was a boundary; 2) the SDIR signal is high, indicating that the SAM is operating in the output mode; and 3) the SRT signal is high, indicating a SRT operation. The output of NAND gate 206 is provided on one input of a two input NOR gate 208. A pulse derived from the CAS* signal is provided on the other input of NOR gate 208. The CAS* pulse is generated by a CAS one shot 207, which receives the CAS* signal on its input and provides a low going pulse when the CAS* signal falls. NOR gate 208 provides a high pulse to indicate a last bit transfer TAP LOAD when the CAS* pulse is low at the same time the output of NAND gate 206 is low, indicating a SRT cycle when the last address was a boundary. An inverter 212 is coupled to the output of a NOR gate 210 to logically form an OR gate 214. OR gate 214 logically ORs the original TAP LOAD signal received on one of its inputs with the last bit transfer TAP LOAD signal provided from NOR gate 208 received on its other input.

OR gate 214 provides the new TAP LOAD signal representing the new serial load pulse covering all cases including the original TAP LOAD cases derived from the SCK pulse under either the conditions of a boundary crossing after a SRT cycle or the conditions of a look ahead load, and the TAP LOAD case for the last bit transfer on a split SAM boundary. Thus, the present invention, as embodied in VRAM 200 includes split transfer load control circuitry 202 to latch the state of the boundary detect signal on each serial clock cycle for use when a SRT cycle occurs. Split transfer load control circuitry 202 then generates a new TAP LOAD pulse to reload the tap address from tap latch 44 timed from the falling edge of the CAS* signal, at which time the tap address is valid.

Figure 12:
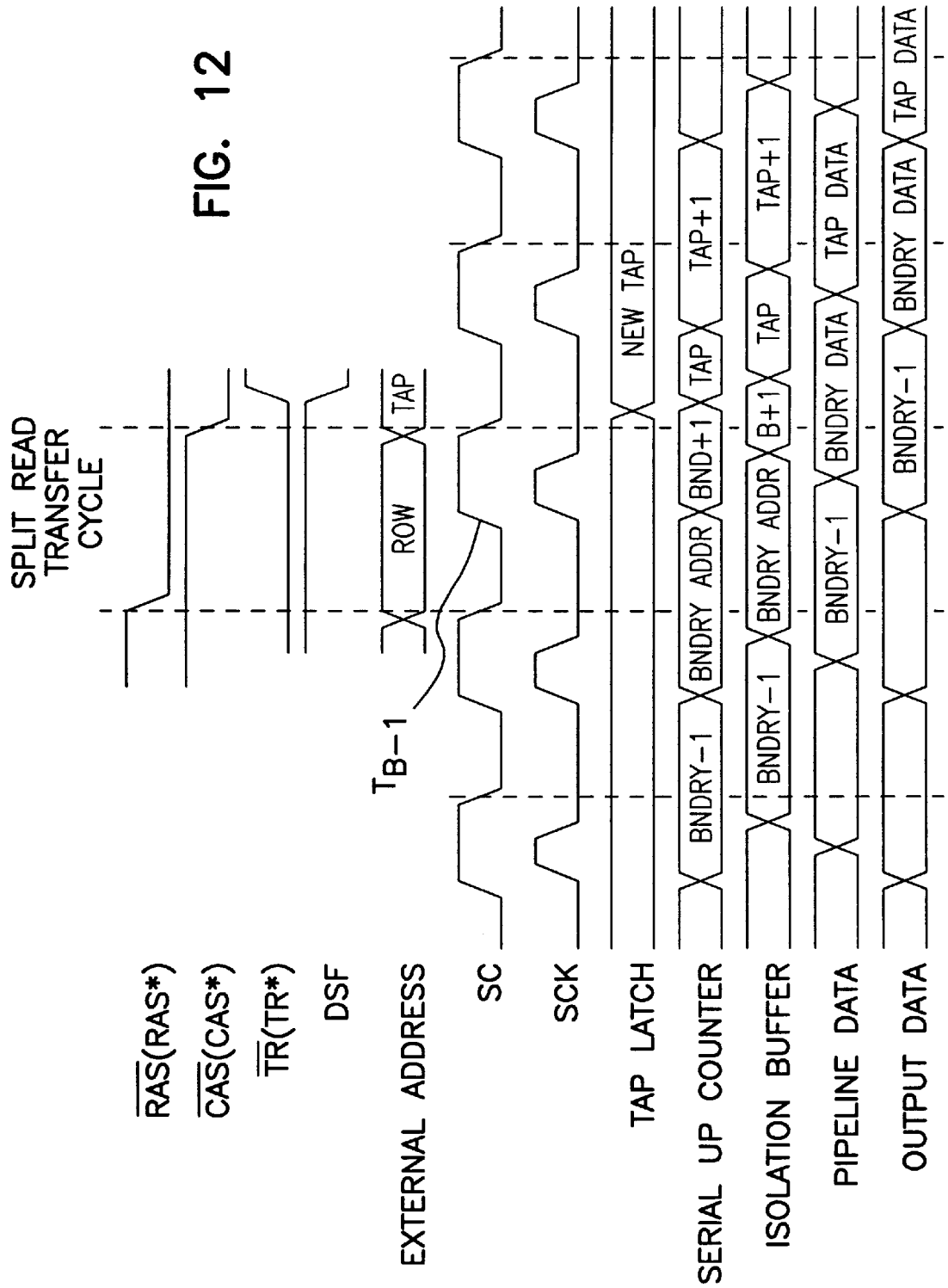
FIG. 12 is a timing diagram illating a split read transfer sequence according to the present invention for the VRAM of FIG. 9 where the split read transfer cycle is after the serial clock which clocks the boundary −1 SAM data from the VRAM.

FIG. 12 illustrates in a timing diagram the operation of the split transfer load control circuitry 202 according to the present invention, which permits SRT operations to be recognized after the rising edge of the SC signal used to transfer the boundary −1 SAM data bit from read register 92 to output latch 96. This is the same situation illustrated in FIG. 8 where the prior art VRAM 18 failed to perform the SRT operation under these conditions. In FIG. 12, just like in FIG. 8, the falling edge of the RAS* signal is during the time that the address from upcounter 48 is at the SAM boundary, and the falling edge of the CAS* signal occurs after the rising edge of the SC pulse at time $T_{B-1}$ for clocking the boundary −1 SAM data bit from read register 92 to output latch 96. According to the present invention, the split transfer load control circuitry 202 provides the new TAP LOAD signal to reload the new tap address from tap latch 44 to up-counter 48 on the falling edge of the CAS* signal rather than the rising edge of the SCK signal. The new tap address is sent into isolation buffer 52, and is then used to drive the pipeline data corresponding to the new tap address, which is then provided from VRAM 200 as output data corresponding to the new tap address at the rising edge of the SC pulse. After the new tap address from tap latch 44 is loaded, up-counter 48 starts to increment the address starting from the tap address.

Figure 13:
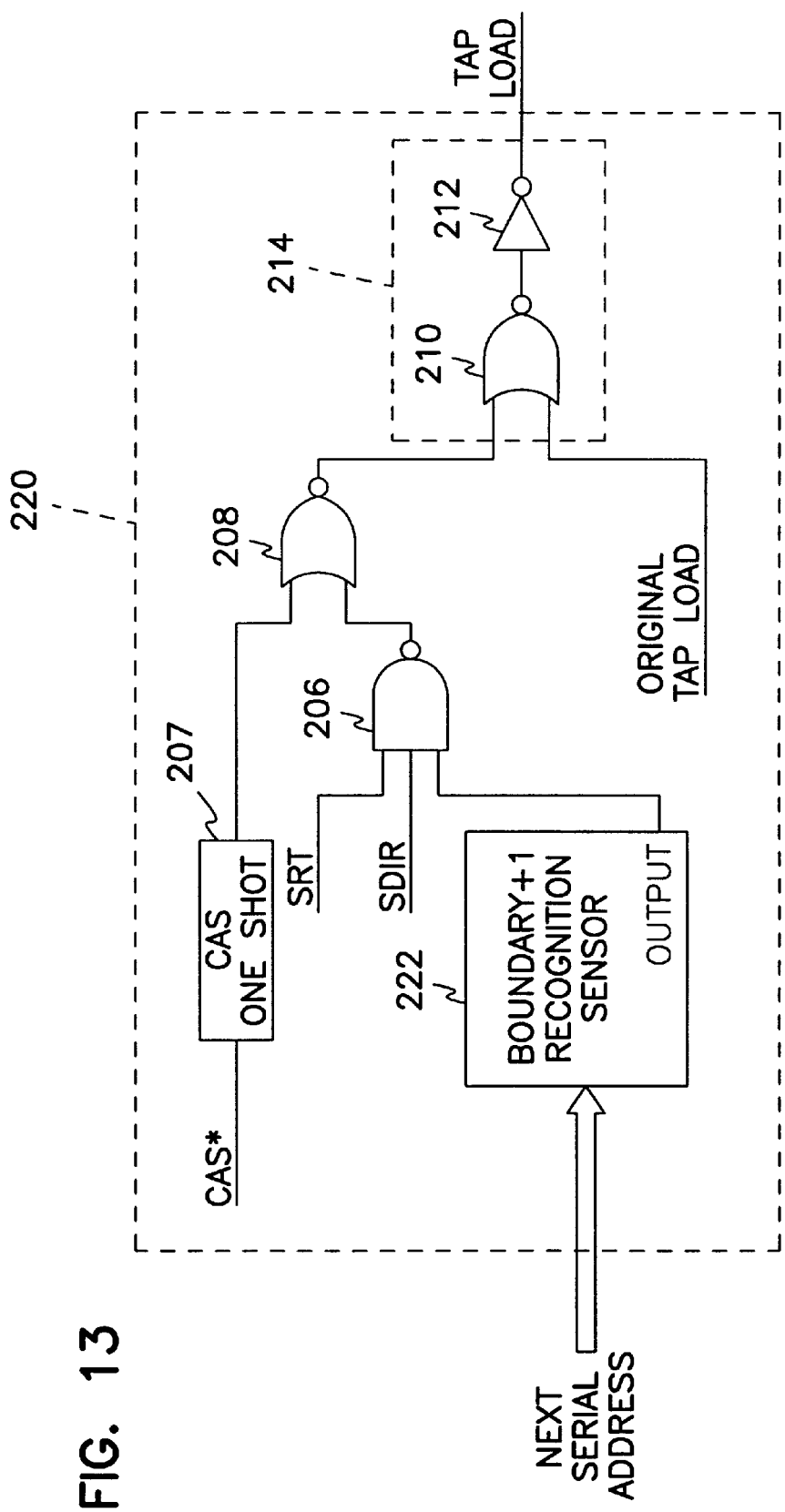
FIG. 13 is a schematic diagram illustrating details of an alternative embodiment of split transfer load control circuitry for the VRAM of FIG. 9.

FIG. 13 is a schematic diagram illustrating the logical components of split transfer load control circuitry 220 representing an alternative embodiment of the split transfer load control circuitry 202 illustrated in FIG. 11. In FIGS. 13, much of the logical components of split transfer load control circuitry 220 are similar to the logical components of split transfer load control circuitry 202 described above and illustrated in FIGS. 1. Accordingly, like reference numbers are used to identify elements common to both FIGS. 11 and FIG. 13. As is illustrated in FIG. 13, split transfer load control circuitry 220 receives the serial address directly from isolation buffer 52 (shown in FIG. 9A) instead of receiving the SCK clock signal and the boundary detect signal generated by boundary recognition sensor 154. A boundary +1 recognition sensor 222 receives the next serial address and provides a boundary +1 detect signal to the first input of NAND gate 206. The boundary +1 detect signal indicates that the serial address from upcounter 48 is one past a SAM boundary, and is therefore, substantially equivalent to the trapped boundary signal from boundary latch 204 of split transfer load control circuitry 202.

Similar to split transfer load control circuitry 202, in split transfer load control circuitry 220, NAND gate 206 provides a low signal when: 1) the boundary +1 detect signal is high, indicating that the serial address is one past a SAM boundary; 2) the SDIR signal is high, indicating that the SAM is operating in the output mode; and 3) the SRT signal is high, indicating a SRT operation. OR gate 214 provides the new TAP LOAD signal representing the new serial load pulse covering all cases including the original TAP LOAD cases derived from the SCK pulse under either the conditions of a boundary crossing after a SRT cycle or the conditions of a look ahead load, and the TAP LOAD case for the last bit transfer on a split SAM boundary. Thus, the present invention, as embodied in VRAM 200 optionally includes split transfer load control circuitry 220 to detect boundary +1 conditions of the serial address for use when a SRT cycle occurs. Split transfer load control circuitry 220 then generates a new TAP LOAD pulse to reload the tap address from tap latch 44 timed from the falling edge of the CAS* signal, at which time the tap address is valid.

Conclusion

Thus, a late SRT operation occurring during the last bit transfer to the SAM register, when the address from the upcounter is one past a SAM boundary, invokes the new circuitry according to the present invention to automatically reload the ucounter and properly load the serial pipeline. In this way, the VRAM 200 of the present invention meets the same specifications as a similar VRAM component not equipped with a pipelined SAM architecture. Thus, VRAM 200 restores fuill compatibility to a pipelined SAM architecture VRAM while retaining the peed advantage of the pipelined implementation.

What is claimed is:

1. An integrated circuit responsive to command signals and a tap address signal for providing an output signal, the integrated circuit comprising:

a memory array for storing data;

a serial access register including a first portion and a second portion, each portion having a plurality of cells;

a transfer circuit, including address decoder logic, for transferring selected data from the memory array into the first portion of the serial access register;

a tap address latch for storing the tap address signal;

a pointing circuit, including a counter, responsive to the stored tap address signal for assigning values to an internal address signal, wherein said values start at a tap address signal value;

a reading circuit including an output driver and responsive to the internal address signal to read cells in the second portion of the serial access register identified by the internal address signal, and for providing the output signal corresponding to the read cells;

a timing circuit, including a clock generator, for controlling the transfer circuit, the pointing circuit, and the reading circuit wherein the reading circuit provides the output signal corresponding to a first cell in the second portion while:

(a) the reading circuit reads a second cell in the second portion, (b) the pointing circuit assigns a value to the internal address signal corresponding to a third cell in the second portion, and (c) the transfer circuit transfers selected data from the memory array into the first portion; and a control circuit including a logic circuit and responsive to the command signals and the internal address signal reaching a stop address boundary in the second portion to cause the pointing circuit to re-start the value of the internal address signal at a tap address value in the first portion, and wherein the control circuit is responsive to the command signals up to the stop address boundary to cause the internal address signal to re-start at the tap address value in the first portion.

2. The integrated circuit of claim 1 wherein the control circuit comprises a detection circuit for providing a boundary detect signal indicating that a data bit stored in the cell to be next read by the reading circuit corresponds to the stop address boundary.

3. The integrated circuit of claim 2 wherein the control circuit further comprises a boundary latch to store the state of the boundary detect signal.

4. The integrated circuit of claim 3 wherein the integrated circuit further receives a serial clock signal, and wherein the boundary latch stores the state of the boundary detect signal in response to the serial clock signal.

5. The integrated circuit of claim 1 wherein the control circuit includes a detection circuit for providing a boundary +1 detect signal representing that the internal address signal has a value one past the stop address boundary to indicate that a data bit stored in the cell being read by the reading circuit corresponds to the stop address boundary.

6. The integrated circuit of claim 1 wherein the control circuit comprises a tap load circuit for generating a tap load signal to cause the internal address signal to re-start at the tap address value in the first portion, the tap load signal being generated when a data bit stored in the cell being read by the reading circuit corresponds to the stop address boundary and the command signals indicate an initiation of a split read transfer operation to direct the timing circuit to control the transfer circuit to transfer the selected data into the first portion of the serial access register while the reading circuit reads data from the second portion.

7. The integrated circuit of claim 6 wherein the tap load signal is generated in response to a state of one of the command signals which indicates that valid data is the tap address latch.

8. The integrated circuit of claim 7 wherein the one command signal is a column address strobe signal, wherein the tap address latch is responsive to the column address strobe signal to store a state of the tap address signal.

9. The integrated circuit of claim 1 wherein the location of the stop address boundary is programmable.

10. The integrated circuit of claim 9 wherein more than one stop address boundary can be programmed for each portion of the serial access register.

11. An integrated circuit responsive to command signals and a tap address signal for providing an output signal, the integrated circuit comprising:

a memory array for storing data;

a serial access register including a first portion and a second portion, each portion having a plurality of cells;

a transfer circuit, including address decode logic, for transferring selected data from the memory array to cells in the serial access register;

a tap address latch for storing the tap address signal;

serial access circuit for serially accessing cells in the serial access register to provide the output signal, wherein the serial access circuit comprises:

a pointing circuit including a counter and responsive to the stored tap address signal for assigning values to an internal address signal, wherein said values start at a value of the tap address signal, a reading circuit including a data sensor for reading cells in the serial access register identified by the internal address signal, and an output driver for providing the output signal corresponding to the read cells, and a timing circuit, including a clock generation circuit, for controlling the pointing circuit and the reading circuit so that the reading circuit provides the output signal corresponding to a first cell while the reading circuit reads a second cell, and the pointing circuit assigns a value to the internal address signal corresponding to a third cell; and a control circuit including a logic circuit and responsive to the command signals and the internal address signal to initiate and control a split read transfer operation wherein the transfer circuit transfers the selected data into the first portion of the serial access register while the serial access circuit accesses data from the second portion, the control circuit responsive to the internal address signal reaching a stop address boundary in the second portion to cause the pointing circuit to re-start the value of the internal address signal at the tap address value and to cause the serial access circuit to switch the accessing to the tap address value in the first portion, and wherein the control circuit is responsive to the command signals up to the stop address boundary to initiate the split read transfer operation and to cause the internal address signal to be re-started at the tap address value.

12. The integrated circuit of claim 11 wherein the control circuit comprises a detection circuit for providing a boundary detect signal indicating that the cell to be next read by the reading circuit corresponds to the stop address boundary.

13. The integrated circuit of claim 12 wherein the control circuit further comprises a boundary latch to store the state of the boundary detect signal.

14. The integrated circuit of claim 13 wherein the integrated circuit further receives a serial clock signal, and wherein the boundary latch stores the state of the boundary detect signal in response to the serial clock signal.

15. The integrated circuit of claim 11 wherein the control circuit includes detection circuit for providing a boundary +1 detect signal representing that the internal address signal has a value one past the stop address boundary to indicate that the data bit stored in the cell being read by the reading circuit corresponds to the stop address boundary.

16. The integrated circuit of claim 11 wherein the control circuit comprises a tap load circuit for generating a tap load signal to cause the internal address signal to re-start at the tap address value in the first portion, the tap load signal being generated when the cell being read by the reading circuit corresponds to the stop address boundary and the command signals indicate an initiation of the split read transfer operation.

17. The integrated circuit of claim 16 wherein the tap load signal is generated in response to a state of one of the command signals which indicates that valid data is the tap address latch.

18. The integrated circuit of claim 17 wherein the one command signal is a column address strobe signal, wherein the tap address latch is responsive to the column address strobe signal to store a state of the tap address signal.

19. The integrated circuit of claim 11 wherein the location of the stop address boundary is programmable.

20. The integrated circuit of claim 19 wherein more than one stop address boundary can be programmed for each portion of the serial access register.

* * * * *

UNITED STATES PATENT AND TRADEMARK OFFICE
CERTIFICATE OF CORRECTION

PATENT NO. : 6,029,235
DATED : February 22, 2000
INVENTOR(S) : Morgan

It is certified that error appears in the above-indentified patent and that said Letters Patent is hereby corrected as shown below:

On title page, item [54] and Col. 1, line 1 delete "Automatic Reloading" and insert --Automatic Pipeline Reloading--, therfor.

Signed and Sealed this

Tenth Day of April, 2001

Attest:

NICHOLAS P. GODICI

*Attesting Officer*  *Acting Director of the United States Patent and Trademark Office*